(12) United States Patent
De Vries

(10) Patent No.: US 7,244,534 B2
(45) Date of Patent: Jul. 17, 2007

(54) DEVICE MANUFACTURING METHOD

(75) Inventor: Alex De Vries, Meerlo (NL)

(73) Assignee: ASML Netherlands B.V., Veldhoven (NL)

( * ) Notice: Subject to any disclaimer, the term of this patent is extended or adjusted under 35 U.S.C. 154(b) by 629 days.

(21) Appl. No.: 10/830,408

(22) Filed: Apr. 23, 2004

(65) Prior Publication Data
US 2005/0238970 A1  Oct. 27, 2005

(51) Int. Cl.
G03F 9/00 (2006.01)
G03C 5/00 (2006.01)

(52) U.S. Cl. ............................ 430/22; 430/30; 430/312

(58) Field of Classification Search .................. 430/22, 430/30, 312; 355/53, 77; 356/399–401; 438/401
See application file for complete search history.

(56) References Cited

U.S. PATENT DOCUMENTS 5,361,132 A * 11/1994 Farn ........................ 356/509
6,768,539 B2 * 7/2004 Gui et al. .................... 355/53
6,936,385 B2 * 8/2005 Lof et al. .................... 430/22

* cited by examiner

Primary Examiner—Christopher G. Young
(74) Attorney, Agent, or Firm—Pillsbury Winthrop Shaw Pittman LLP

(57) ABSTRACT

A method of manufacturing devices with device layers on both sides of a substrate according to an embodiment of the invention includes ensuring that the movements of the substrate during the exposure of the backside are a mirror image of the movements during the exposure of the frontside. In an application of such a method, positioning errors that are characteristic of direction of movement are thus reversed in the backside exposure as compared to the frontside exposure, such that the net overlay error between front and backside is zero or near zero. Embodiments of the invention may be used to reduce overlay errors arising out of certain types of positioning error at no cost, either in machine modifications or throughput.

20 Claims, 3 Drawing Sheets

DEVICE MANUFACTURING METHOD

BACKGROUND

1. Field of the Invention

The present invention relates to device manufacturing methods using lithographic apparatus.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of MEMS (microelectromechanical systems), MOEMS (microoptoelectromechanical systems), integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning means is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for, e.g., increasing the numerical aperture of projection systems.

Although considerable efforts are made to ensure that the positioning of the substrate during an exposure is as accurate as possible, position errors nevertheless remain. These may be of the order of 10–20nm in a stepper or 5–10 nm in a scanner and are generally tolerable within an overall overlay budget of perhaps 100–500nm. In many cases, the absolute position of the devices on a substrate is less important than the overlay error (that is, the error in position of a layer relative to the layers above and below it), in which case the residual positioning errors can be tolerated. However, there is increasing demand to be able to manufacture devices on both sides of a substrate, and in many cases it is important that the devices on the frontside of the substrate line up accurately with those on the backside. That imposes considerably stricter requirements on the absolute positioning accuracy, because the overlay error between front and backside devices may be up to twice the absolute positioning error.

SUMMARY

A device manufacturing method according to one embodiment of the invention comprises projecting at least one pattern onto a first series of target portions on a first side of a substrate; rotating the substrate about an axis; and projecting at least one pattern onto a second series of target portions on a second side of the substrate, where the second series of target portions corresponds to the first series of target portions. Relative movements of the substrate during projecting at least one pattern onto a second series of target portions are a mirror image about the axis of relative movements of the substrate during projecting at least one pattern onto a first series of target portions.

A device manufacturing method according to another embodiment of the invention comprises transferring a pattern onto each of n target portions on a first side of a substrate in sequence from 1 to n, and transferring a pattern onto each of n target portions on a second side of a substrate in sequence from 1 to n. For each i from 1 to n, the i-th target portion on the first side is substantially directly opposite the i-th target portion on the second side.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiments of the invention include device manufacturing methods that can be used to reduce overlay errors between devices on opposite sides of a substrate.

Figure 1:
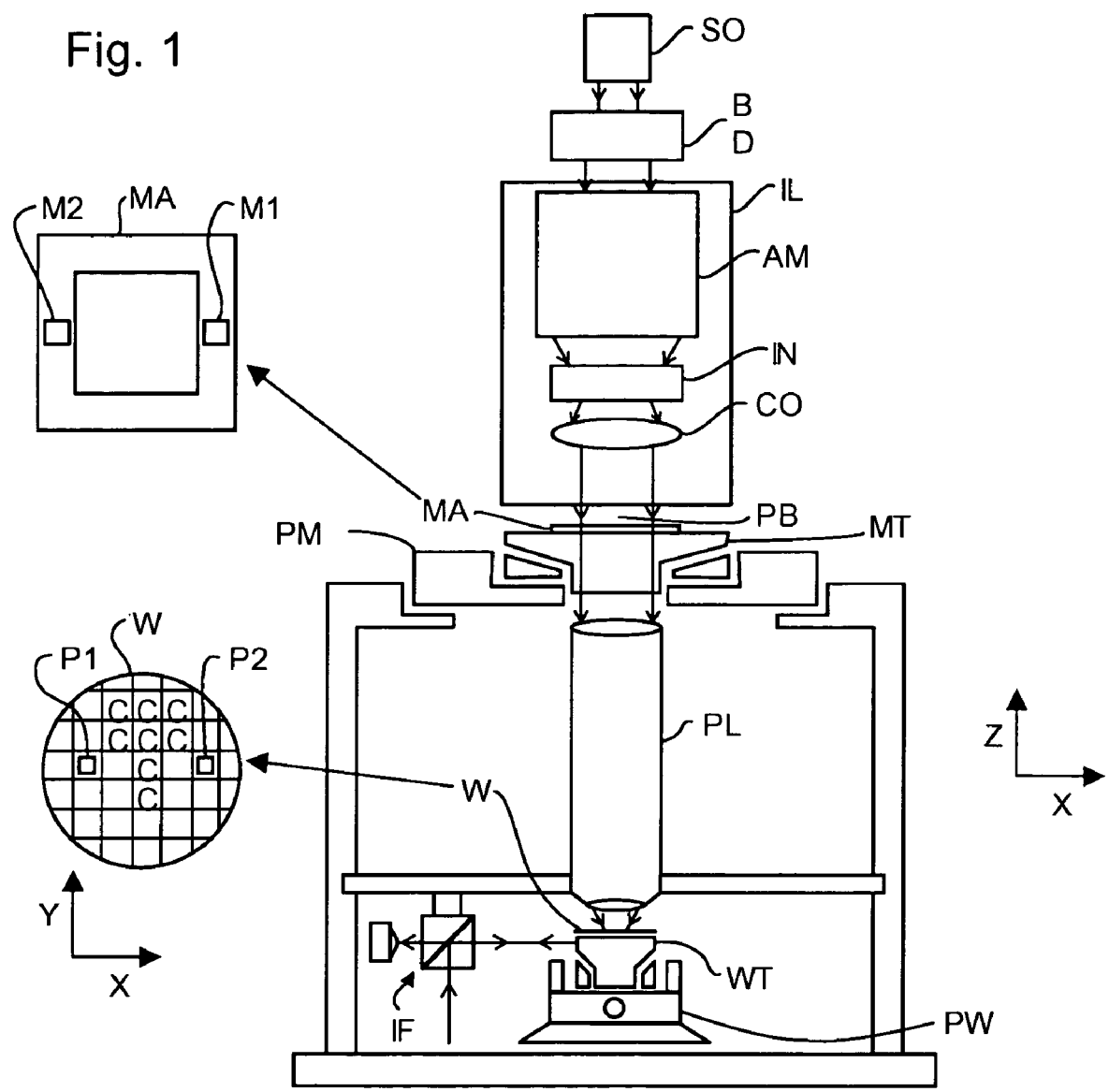
FIG. 1 depicts a lithographic apparatus which may be used to perform a method according to an embodiment of the invention.

FIG. 1 schematically depicts a lithographic apparatus which may be used to perform methods of the invention. The apparatus comprises:

an illumination system (illuminator) IL for providing a projection beam PB of radiation (e.g. UV radiation or DUV radiation).

a first support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the patterning means MA, which is held on the object table MT. Having traversed the mask MA, the projection beam PB passes through the lens PL, which focuses the beam onto a target portion C of the substrate W. With the aid of the second positioning device PW and position sensor IF (e.g. a capacitive sensor, an interferometric device and/or linear encoder), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning means, and the substrate table WT is moved or scanned while a pattern imparted to the projection beam is projected onto a target portion C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed.

In many cases, positioning errors are found to be systematic and characteristic for stage movement speed and/or direction, such that if all layers of a device are imaged using the same sequence of stage movements, the positioning errors in each layer will have the same or similar magnitude and direction and so the overlay error will be reduced.

Figure 2:
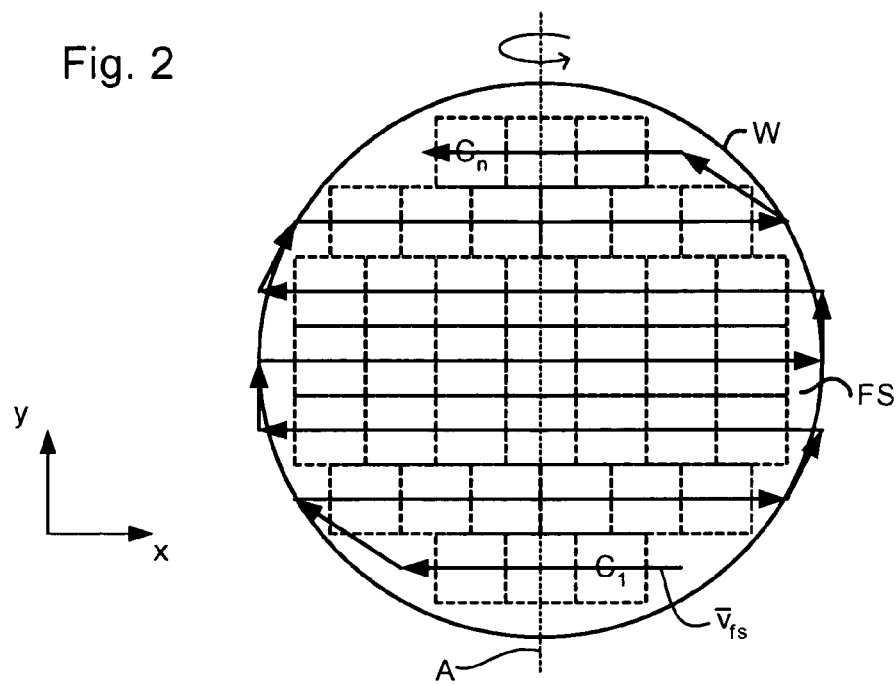
FIG. 2 depicts a substrate and a movement pattern for exposure of the frontside in a step-and-repeat mode.
Figure 3:
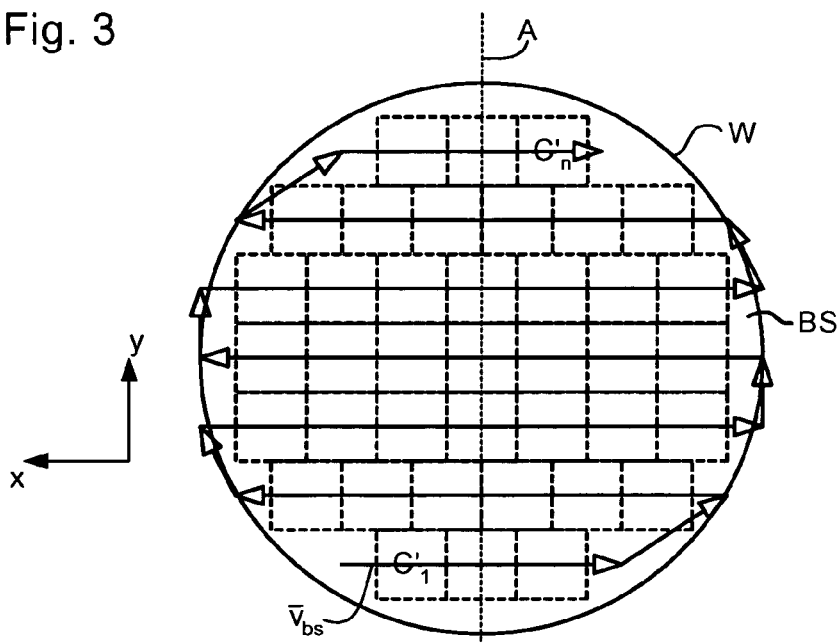
FIG. 3 depicts the substrate of FIG. 2 and a movement pattern for exposure of the backside.

FIG. 2 shows a wafer W on the frontside FS of which are to be exposed a series of target portions $C_1$ to $C_n$ in step mode. To do this, the substrate is moved in a meander path so that the image field of the projection system passes along a path indicated by the vector $\bar{v}_{fs}$, with the substrate being stopped at each target portion to perform an exposure. When a layer or all layers of the frontside have been completed, the substrate W is rotated (flipped) around the axis A, as indicated by the arrow (though the direction of rotation does not matter) for exposure of target portions $C'_1$ to $C'_n$ on the backside BS. The meander path used to perform these exposures is shown in FIG. 3 by vector $\bar{v}_{bs}$. Vector $\bar{v}_{bs}$ is a mirror image of vector $\bar{v}_{fs}$ in the axis A about which the substrate was rotated.

The overlay error ($\Delta e$) between the front and backside images is equal to the difference between the respective overlay errors $e_{fs}$ and $e_{bs}$, so that:

$$\Delta e = e_{fs} - e_{bs} \quad (1)$$

The frontside and backside overlay errors are functions of the respective movements, $M_{fs}$ and $M_{bs}$, thus:

$$e_{fs} = f(\bar{\nabla}_{fs}) \quad (2)$$

$$e_{bs} = b(\bar{\nabla}_{bs}) \quad (3)$$

Substituting into (1) gives $$\Delta e = f(\bar{\nabla}_{fs}) - f(\bar{\nabla}_{bs}) \quad (4)$$

However due to the rotation of the meander pattern and the substrate between front and backside exposures, the front and backside movements are the same (in the coordinate system of the wafer) so that $$\bar{\nabla}_{fs} = \bar{\nabla}_{bs} \quad (5)$$

Which leads directly to $$\Delta e = f(\bar{\nabla}_{fs}) - f(\bar{\nabla}_{bs}) = 0 \quad (6)$$

On the other hand, without rotation of the meander pattern:

$$\bar{\nabla}_{fs} = -\bar{\nabla}_{bs} \quad (7)$$

leading to $$\Delta e = f(\bar{\nabla}_{fs}) - f(\bar{\nabla}_{bs}) \quad (8)$$
$$= f(\bar{\nabla}_{fs}) - f(-\bar{\nabla}_{fs})$$
$$= 2 \cdot f(\bar{\nabla}_{fs})$$

Figure 4:
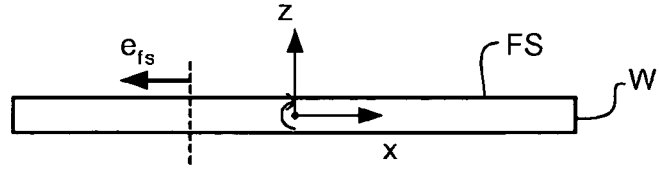
FIGS. 4 and 5 are views used to explain how positioning errors combine to give zero or near-zero overlay error in a method according to an embodiment of the invention.
Figure 5:
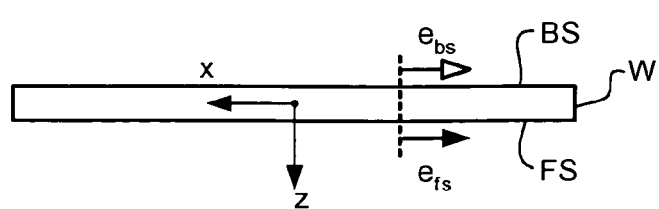

In other words, since in rotating the substrate to perform the backside exposures, the coordinate system is also rotated, this means that the image exposed onto the backside overlies the image exposed on the frontside to a high degree of accuracy (e.g. save for random errors and systematic errors not dependent on direction of movement), as shown in FIGS. 4 and 5. Note that the coordinate system is rotated between FIGS. 4 and 5. Positioning errors in the direction parallel to the axis A manifest in the same sense in the backside exposures as in the frontside exposures, but since that axis of the coordinate system remains invariant during the rotation of the wafer, these errors also correspond in the front and backside exposures and hence result in minimum overlay error.

Figure 6:
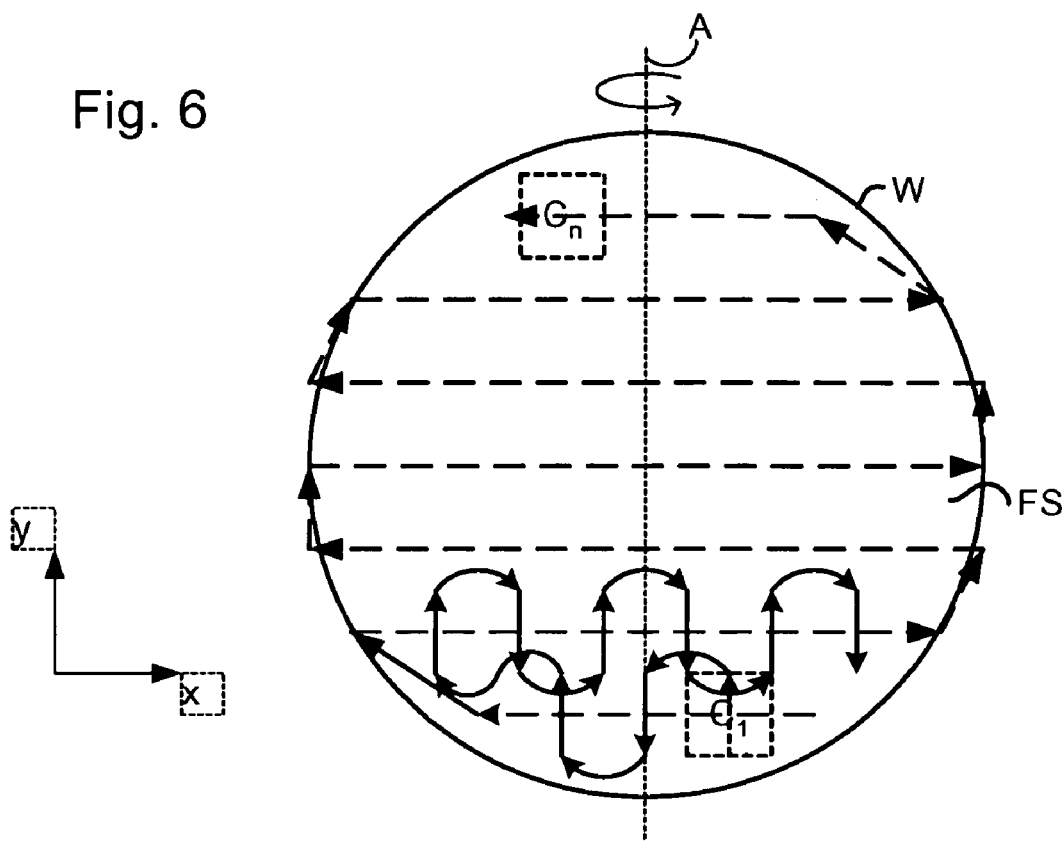
FIG. 6 depicts a substrate and a movement pattern for exposure of the frontside in a scan mode.
Figure 7:
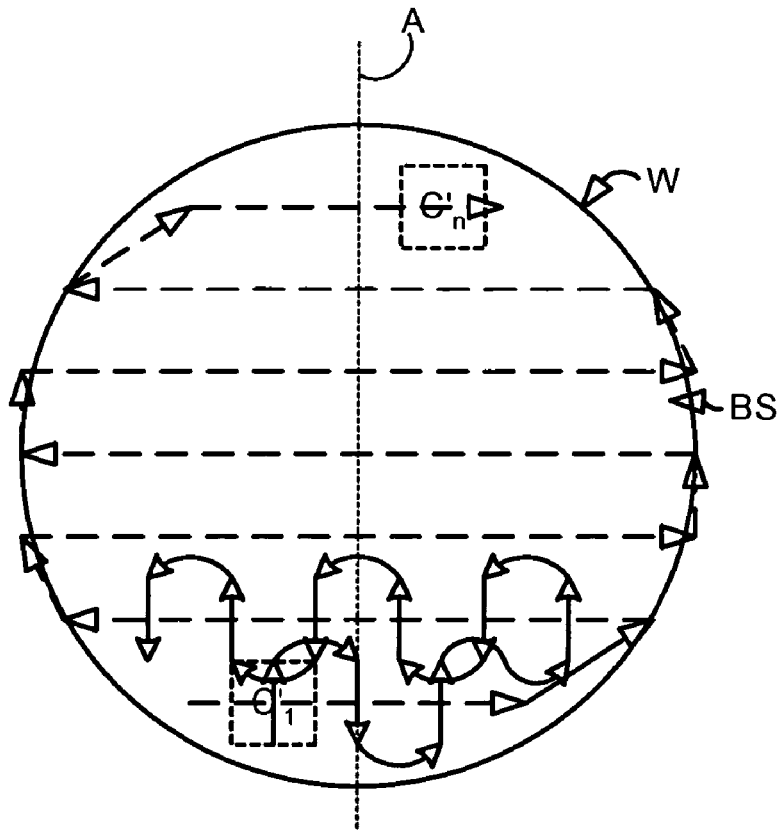
FIG. 7 depicts the substrate of FIG. 6 and a movement pattern for exposure of the backside.

Methods according to embodiments of the present invention may also be applied in a scan mode, as shown in FIGS. 6 and 7. The movement pattern for a scan mode exposure of a series of substrates comprises a small scale meander superimposed on a movement pattern such as the large scale meander of a step mode exposure series, as shown in FIG. 6. In an exemplary method, both the large scale meander and the small scale meander, i.e. the total substrate movement, are mirrored for the backside exposures, shown in FIG. 7, such that the same cancellation applies as in the step mode method described above.

By ensuring that the movements of the substrate during the exposure of the backside are a mirror image of the movements during the exposure of the frontside, any positioning errors that are characteristic of direction of movement will be reversed in the backside exposure as compared to the frontside exposure, and the net overlay error between front and backside will be zero or near zero. At least some methods according to embodiments of the invention may therefore be used to reduce overlay errors arising out of certain types of positioning error at no cost, either in machine modifications or throughput.

Preferably, all device layers are formed on the frontside with the same movement pattern and all device layers formed on the backside are formed using the same, complementary movement pattern. However if there are non-critical layers a different movement pattern may be used if there is some advantage to that.

Methods according to embodiments of the invention may be employed in both steppers, in which the whole of each target portion is exposed at once whilst the substrate is still, or in scanners in which each target portion is exposed during a scanning movement of the substrate. In the latter case, both the pattern of movements between the scanned exposures and the scanned exposures themselves should be reversed for exposure of the backside. If the axis of rotation of the substrate is parallel to the scanning direction however, the scanning direction for corresponding exposures on opposite sides of the substrate will be the same.

While specific embodiments of the invention have been described above, it will be appreciated that the invention may be practiced otherwise than as described. For example, the embodiments have been described in terms of the substrate moving whilst the pattern or image field (e.g. the projection lens) is fixed but it is of course possible that the pattern or image field (e.g. the projection lens and/or patterning device) would move whilst the substrate is stationary. While transfer of a pattern by projection is described, other modes of transfer such as proximity exposure and direct methods such as nanoimprinting are also contemplated.

Embodiments of the invention also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. A device manufacturing method comprising:
   projecting at least one pattern onto a first series of target portions on a first side of a substrate;
   rotating the substrate about an axis; and
   projecting at least one pattern onto a second series of target portions on a second side of the substrate, said second series of target portions corresponding to said first series of target portions;
   wherein relative movements of said substrate during said projecting at least one pattern onto a second series of target portions are a mirror image about said axis of relative movements of said substrate during said projecting at least one pattern onto a first series of target portions.

2. The device manufacturing method according to claim 1, wherein a plurality of patterns are projected onto said first series of target portions to build up a device from a plurality of layers, and
   wherein during projection of all of said plurality of patterns the same movement pattern is used.

3. The device manufacturing method according to claim 2, wherein a plurality of patterns are projected onto said second series of target portions to build up a device from a plurality of layers, and
   wherein during projection of all of said plurality of patterns the same movement pattern, being a mirror image of the movement pattern used during projection onto the first series of target portions, is used.

4. The device manufacturing method according to claim 1, wherein the whole of each target portion is exposed at once whilst the substrate is still.

5. The device manufacturing method according to claim 1, wherein each target portion is exposed during a scanning movement of the substrate relative to a projection system.

6. The device manufacturing method according to claim 5, wherein the scanning movement of the substrate during each exposure of said second series of target portions is a mirror image of the scanning movement during exposure of the corresponding target portion of said first series.

7. The device manufacturing method according to claim 5, wherein said axis is parallel to the direction of relative motion of said substrate during said scanning movement.

8. The device manufacturing method according to claim 1, wherein the axis is a diameter of the substrate.

9. The device manufacturing method according to claim 1, wherein said rotating comprises rotating the substrate about an axis by 180 degrees between said projecting at least one pattern onto a first series of target portions on a first side of a substrate and said projecting at least one pattern onto a second series of target portions on a second side of the substrate.

10. A device manufacturing method comprising:
    transferring a pattern onto each of n target portions on a first side of a substrate in sequence from 1 to n; and
    transferring a pattern onto each of n target portions on a second side of a substrate in sequence from 1 to n,
    wherein for each i from 1 to n, the i-th target portion on the first side is substantially directly opposite the i-th target portion on the second side.

11. The device manufacturing method according to claim 10, wherein at least one of said transferring a pattern onto each of n target portions on a first side and said transferring a pattern onto each of n target portions on a second side comprises projecting a pattern onto each of the n target portions.

12. The device manufacturing method according to claim 10, said method comprising rotating the substrate about a diameter of the substrate.

13. The device manufacturing method according to claim 12, said method comprising rotating the substrate by 180 degrees about a diameter of the substrate.

14. The device manufacturing method according to claim 12, wherein said transferring a pattern onto each of n target portions on a first side comprises, for at least one of the n target portions, moving the substrate parallel to the diameter during said transferring.

15. The device manufacturing method according to claim 10, wherein said transferring a pattern onto each of n target portions on a first side comprises, for at least one of the n target portions, exposing a pattern onto the target portion while the substrate is still.

16. The device manufacturing method according to claim 10, wherein said transferring a pattern onto each of n target portions on a first side comprises, for at least one of the n target portions, exposing a pattern onto the target portion while the substrate is moving.

17. The device manufacturing method according to claim 10, wherein said transferring a pattern onto each of n target portions on a first side of a substrate in sequence from 1 to n includes moving at least one of the substrate and the pattern relative to the other, in a plane substantially parallel to the first side, in a first path including movement between each consecutive pair of transfers in the sequence, and
    wherein said transferring a pattern onto each of n target portions on a second side of the substrate in sequence from 1 to n includes moving at least one of the substrate and the pattern relative to the other, in a plane substantially parallel to the first side, in a second path including movement between each consecutive pair of transfers in the sequence, and
    wherein the second path in its plane is substantially identical to the first path in its plane.

18. The device manufacturing method according to claim 17, said method further comprising transferring another pattern onto each of the n target portions on the first side of the substrate in sequence from 1 to n,
    wherein said transferring another pattern onto each of the n target portions on a first side of a substrate includes moving at least one of the substrate and the pattern relative to the other, in a plane substantially parallel to the first side, in the first path.

19. The device manufacturing method according to claim 18, said method further comprising transferring another pattern onto each of the n target portions on the second side of the substrate in sequence from 1 to n, wherein said transferring another pattern onto each of the n target portions on the second side of the substrate includes moving at least one of the substrate and the pattern relative to the other, in a plane substantially parallel to the first side, in the second path.

20. A storage medium storing a set of machine-executable instructions, said set describing a device manufacturing method comprising:

transferring a pattern onto each of n target portions on a first side of a substrate in sequence from 1 to n; and transferring a pattern onto each of n target portions on a second side of a substrate in sequence from 1 to n, wherein for each i from 1 to n, the i-th target portion on the first side is substantially directly opposite the i-th target portion on the second side.

\* \* \* \* \*